US012790763B2

(12) United States Patent
Wada

(10) Patent No.: US 12,790,763 B2
(45) Date of Patent: Nov. 10, 2026

(54) RAIL

(71) Applicant: Daifuku Co., Ltd., Osaka (JP)

(72) Inventor: Yoshinari Wada, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 593 days.

(21) Appl. No.: 18/234,107

(22) Filed: Aug. 15, 2023

(65) Prior Publication Data

US 2024/0060244 A1 Feb. 22, 2024

(30) Foreign Application Priority Data

Aug. 18, 2022 (JP) ................................ 2022-130473

(51) Int. Cl.

*E01B 25/04* (2006.01)
*B61B 13/02* (2006.01)
*B65G 35/00* (2006.01)
*H05K 7/14* (2006.01)

(52) U.S. Cl.

CPC .............. *E01B 25/04* (2013.01); *B61B 13/02* (2013.01); *B65G 35/00* (2013.01); *H05K 7/1489* (2013.01)

(58) Field of Classification Search

CPC ...... H05K 7/1489; B61B 13/02; B65G 35/00; E01B 25/04; E01B 2202/02; E01B 25/02
See application file for complete search history.

(56) References Cited

U.S. PATENT DOCUMENTS 10,017,190 B2 * 7/2018 Beauvais .................. B61B 3/02
2013/0126455 A1 * 5/2013 Kuo ....................... A47B 88/57 248/220.21

FOREIGN PATENT DOCUMENTS

| | | | | | |
|---|---|---|---|---|---|
| CN | 111809457 | A | * | 10/2020 | E01B 25/08 |
| CN | 112962367 | A | * | 6/2021 | E01B 25/02 |
| JP | 201820342 | A | | 2/2018 | |
| KR | 20160004491 | A | * | 1/2016 | E01B 19/003 |
| KR | 101665091 | B1 | * | 10/2016 | B61H 7/04 |
| KR | 20180069196 | A | * | 6/2018 | E01B 25/04 |
| KR | 102049541 | B1 | * | 11/2019 | B61F 3/00 |

* cited by examiner

*Primary Examiner* — Cheng Lin
(74) *Attorney, Agent, or Firm* — The Webb Law Firm

(57) ABSTRACT

A rail configured to guide a carriage is provided. The rail includes a first unit and a second unit; and a coupling mechanism. The coupling mechanism is configured to couple a first target member, which is a coupling target that is either a first support or a first rack, to a second target member, which is a coupling target that is a second support or a second rack. The coupling mechanism includes a coupling member; a first fixing member; and a second fixing member. The first fixing member is configured to position the first target member and the coupling member, and the second fixing member is configured to adjust relative positions of the second target member and the coupling member, and is configured to fix the second target member and the coupling member at adjusted relative positions.

10 Claims, 9 Drawing Sheets

RAIL

CROSS-REFERENCE TO RELATED APPLICATION

This application claims priority to Japanese Patent Application No. 2022-130473, filed on Aug. 18, 2022, the disclosure of which is hereby incorporated by reference in its entirety.

BACKGROUND OF THE INVENTION

1. Field of the Invention

The present invention relates to a rail that guides a carriage traveling in a predetermined travel direction.

2. Description of Related Art

For example, JP 2018-20342A (Patent Document 1) discloses a configuration of a rail that guides a carriage traveling in a travel direction. Hereinafter, the reference signs given in parentheses in "Description of the Related Art" correspond to those used in Patent Document 1.

The rail (A) disclosed in Patent Document 1 includes a plurality of units. The plurality of units are connected in series to each other, and are configured to guide a carriage in the travel direction. Each of the plurality of units includes a rail member (10) and a rack member (20). The rack member (20) is mounted on a side surface (mounting surface 12*a*) of a body (12) of the rail member (10). Ahead section (11) of the rail member (10) has, on the top thereof, a travel surface (11*a*) on which travel rollers (4) of the carriage roll, and has, on a side surface, a guide surface (11*b*) on which guide rollers (5) of the carriage roll. The rack member (20) meshes with a pinion (6) of the carriage (travel carriage B). When the pinion (6) is driven by a drive motor (7) of the carriage, the carriage is guided by the rail member (10) to travel in the travel direction.

In the rail (A) disclosed in Patent Document 1, each of the plurality of units is supported by a support member (adjustment block 31) from below. A plurality of adjustment bolts (33) for adjusting the position of each unit in a horizontal plane, and anchor bolts (32) for fixing the unit to the support member are inserted into the support member. Also, a plurality of level adjustment bolts (34) for adjusting the position of each unit in an up-down direction are inserted into the rail member (10) of the unit. The rail (A) disclosed in Patent Document 1 requires the use of such varying bolts for each unit to perform operations of adjusting the relative positions of adjacent units, resulting in a problem that the number of operation steps is increased when installing the rail (A) and the installation is complicated. Also, since the plurality of position adjustment bolts are provided for each unit and the support member, there is also a problem that the rail as a whole tends to be a large piece of equipment.

SUMMARY OF THE INVENTION

Therefore, in view of the foregoing, there is a demand for realization of a rail that includes a plurality of units, and can facilitate an operation of coupling adjacent units to each other at appropriate relative positions at the time of installation.

According to the present disclosure, a rail configured to guide a carriage traveling in a predetermined travel direction, the rail comprising:

a first unit and a second unit each extending in the travel direction, and lined up in series in the travel direction; and a coupling mechanism configured to couple the first unit and the second unit to each other, wherein the first unit and the second unit each include:
- a support;
- a rack fixed to the support and configured to engage with a pinion of the carriage; and
- a rail body fixed to the support while being parallel to the rack, and configured to guide travel of the carriage, with a width direction being a direction orthogonal to the travel direction when viewed in an up-down direction, a first side in the width direction being one side in the width direction, a second side in the width direction being another side in the width direction, a first support being the support of the first unit, a second support being the support of the second unit, a first rack being the rack of the first unit, and a second rack being the rack of the second unit, the coupling mechanism is configured to couple a first target member, which is a coupling target that is either the first support or the first rack, to a second target member, which is a coupling target that is either the second support or the second rack, the coupling mechanism includes:
- a coupling member having a reference abutment face configured to abut against both a first reference face, which is a reference face of the first target member facing the first side in the width direction, and a second reference face, which is a reference face of the second target member facing the first side in the width direction;
- a first fixing member configured to fix the coupling member to the first target member; and
- a second fixing member configured to fix the coupling member to the second target member, the first fixing member is attachable to and detachable from at least either the coupling member or the first target member, and is configured to position the first target member and the coupling member by being attached, and the second fixing member is configured to adjust relative positions of the second target member and the coupling member, and is configured to fix the second target member and the coupling member at adjusted relative positions.

According to this configuration, the relative positions of the first target member and the second target member are adjusted, and then the first target member and the coupling member are fixed using the first fixing member, and the second target member and the coupling member are fixed using the second fixing member. This makes it possible to couple the first unit and the second unit in an appropriate relative position relationship.

Also, even when separating the coupled first and second units from each other, an operator can cancel the fixation between the first target member and the coupling member by the first fixing member, while maintaining the fixation between the second target member and the coupling member by the second fixing member. In doing so, when coupling the first unit and the second unit again, the operator can couple the first target member and the second target member in the previously adjusted relative position relationship simply by fitting the first fixing member.

That is to say, when the relative positions of the first target member and the second target member are adjusted and then the second target member and the coupling member are fixed to each other using the second fixing member, there is no need to perform the operation of adjusting the relative positions of the first target member and the second target member again when installing the rail, and the operator can couple the first unit and the second unit in an appropriate relative position relationship simply by fitting the first fixing member.

Therefore, according to this configuration, when installing the rail including the plurality of units, it is possible to easily perform an operation of coupling adjacent units to each other at appropriate relative positions.

Further features and advantages of the rail will become apparent from the following description of exemplary and non-limiting embodiments given with reference to the drawings.

DESCRIPTION OF THE INVENTION

An example of a rail according to an embodiment that is applied to an automated warehouse will be described with reference to the drawings. In the present embodiment, as shown in FIGS. 1 and 2, the automated warehouse includes: a carriage 9 that travels along a travel route; a rail 1; and a storage rack (not shown) for storing a plurality of articles.

Figure 1:
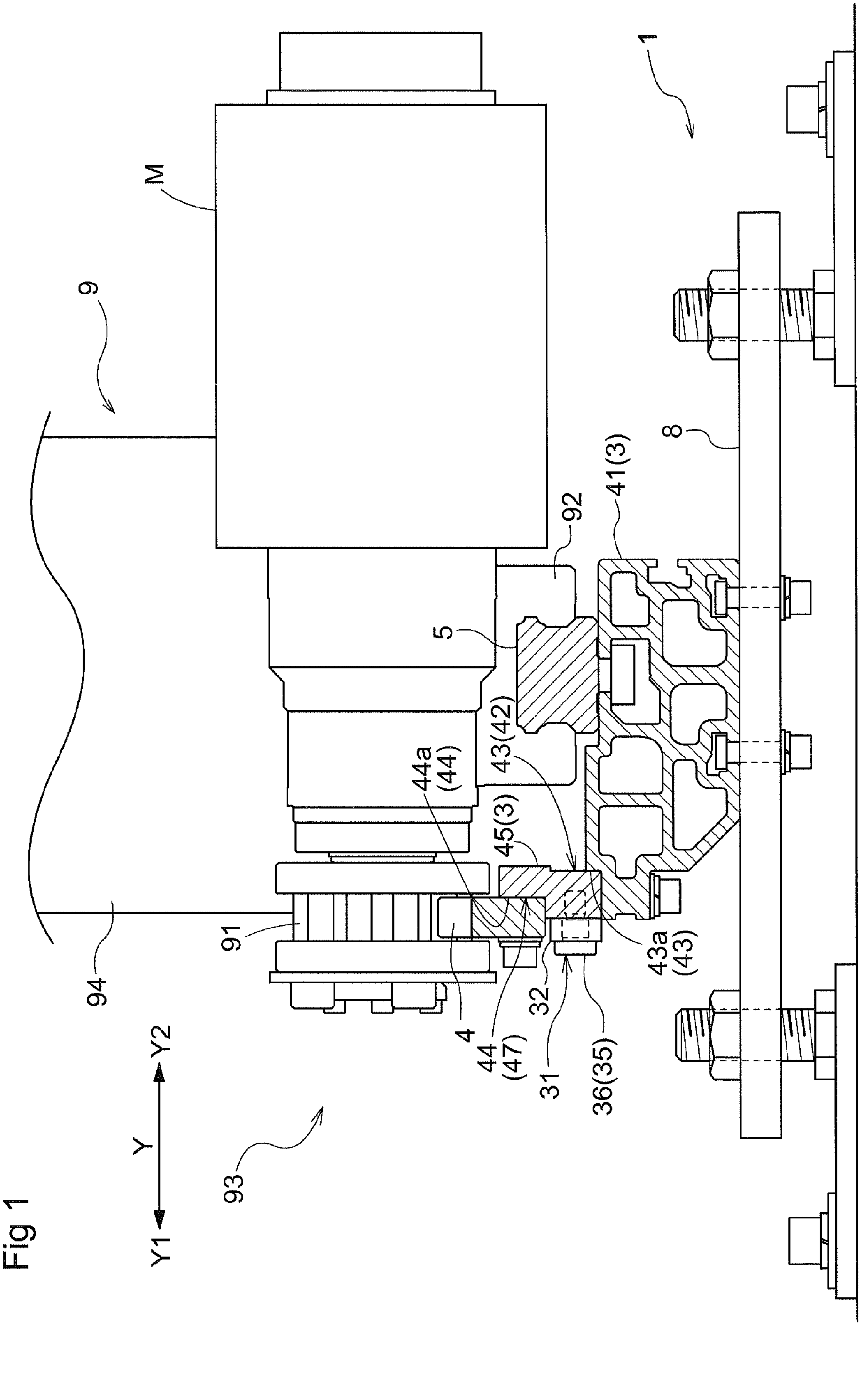
FIG. 1 is a front view illustrating a rail and a carriage.
Figure 2:
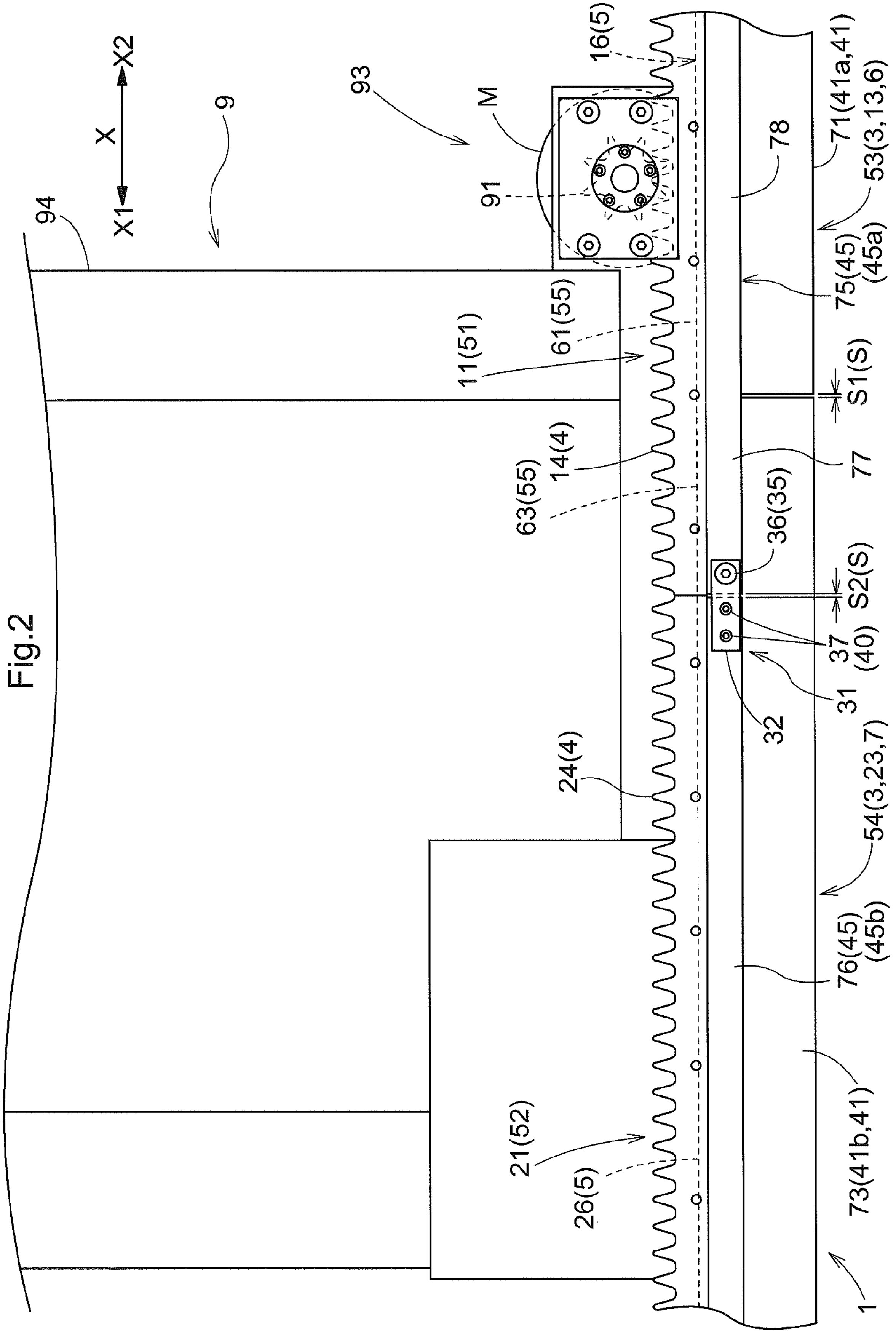
FIG. 2 is a side view illustrating the rail and the carriage.

As shown in FIGS. 1 and 2, the rail 1 guides the carriage 9 traveling in a predetermined travel direction X. Here, the travel direction X is a horizontal direction. In the present embodiment, the travel direction X is defined as being a direction that coincides with the travel route for the carriage 9. The rail 1 is laid along the travel route for the carriage 9. In this example, the rail 1 is formed in a linear fashion because the travel route for the carriage 9 is linear. Also, the rail 1 is laid on a floor surface. Also, the storage rack is provided adjacent to the rail 1. The storage rack has a configuration in which articles can be loaded and unloaded from the side on which the rail 1 is provided. Also, the storage rack includes a plurality of storage sections lined up in an up-down direction (vertical direction) and in the travel direction X, and a plurality of articles (not shown) are stored in the storage sections.

In the present embodiment, as shown in FIGS. 1 and 2, the carriage 9 travels on the rail 1. The carriage 9 is configured to transport an article between a loading/unloading portion of the automated warehouse and the storage sections of the storage rack. Hereinafter, a configuration of the carriage 9 will be described.

As shown in FIGS. 1 and 2, the carriage 9 includes: a travel body section 93; a pinion 91 that engages with a later-described rack 4 of the rail 1; a guided part 92 that is guided by a later-described rail body 5 of the rail 1; and a travel motor M for driving the pinion 91. The travel motor M drives the pinion 91 to add propulsion so that the carriage 9 is guided by the rail body 5 to move in the travel direction X. The pinion 91, the guided part 92, and the travel motor M are provided on the travel body section 93. In this example, the carriage 9 further includes a mast 94 standing upright from the travel body section 93, and a lift (not shown) that moves up and down in the up-down direction along the mast 94. The carriage 9 transports an article placed on the lift. When the carriage 9 transfers the article to a storage section, the carriage 9 travels on the rail 1, stops at a position that corresponds to the destination storage section, and moves the lift upward to the height that corresponds to the destination storage section. The carriage 9 uses a transfer device provided on the lift to pass the article to the storage section. Thus, the carriage 9 is a stacker crane in this example. Note that the carriage 9 does not need to be a stacker crane, and may be configured to not transport any articles.

The following will describe a specific configuration of the rail 1. In the description, a direction orthogonal to the travel direction X when viewed in the up-down direction is defined as a width direction Y, and one side in the width direction Y is defined as a first side Y1 in the width direction, and the other side in the width direction Y is defined as a second side Y2 in the width direction. Here, the width direction Y is a horizontal direction that is orthogonal to the travel direction X. Also, in the present embodiment, one side in the travel direction X is defined as a first side X1 in the travel direction, and the other side in the travel direction X is defined as a second side X2 in the travel direction.

As shown in FIGS. 2 to 5, the rail 1 includes: a first unit 11 and a second unit 21 that extend in the travel direction X and are lined up in series in the travel direction X; and a coupling mechanism 31 configured to couple the first unit 11 and the second unit 21. In the present embodiment, adjacent end portions of the first unit 11 and the second unit 21 that are lined up in series in the travel direction X are coupled to each other by the coupling mechanism 31. An operator or the like disposes, on the travel route for the carriage 9, the first unit 11 and the second unit 21 in series to each other in the travel direction X, and couples them using the coupling mechanism 31. In the example shown in FIG. 3, the rail 1 has a plurality of units including the first unit 11 and the second unit 21. Specifically, the rail 1 has, in addition to the first unit 11 and the second unit 21, a third unit 65. The third unit 65 is lined up in series to the first unit 11 and the second unit 21 in the travel direction X. An end portion of the first unit 11 on the first side X1 in the travel direction, and an end portion of the second unit 21 on the second side X2 in the travel direction are coupled to each other by the coupling mechanism 31, and an end portion of the first unit 11 on the second side X2 in the travel direction, and an end portion of the third unit 65 on the first side X1 in the travel direction are coupled to each other by a coupling mechanism 31. With this, a plurality of (here, three) units are coupled in series to each other into a single rail 1 disposed in the travel direction X. Note that the rail 1 may include more than three units. In this case, preferably, every pair of adjacent units are coupled to each other by a coupling mechanism 31. The following will describe specific configurations of the first unit 11 and the second unit 21.

As shown in FIGS. 1 to 6, the first unit 11 and the second unit 21 each include: a support 3; the rack 4 that is fixed to the support 3 and engages with the pinion 91 of the carriage 9; and the rail body 5 that is fixed to the support 3 while being parallel to the rack 4, and guides the travel of the carriage 9. The rack 4 is fixed to the support 3 while being oriented in the travel direction X. Similarly, the rail body 5 is also fixed to the support 3 while being oriented in the travel direction X. In the present embodiment, the rail body 5 is configured to engage with the guided part 92 of the carriage 9, and guide the guided part 92 in the travel direction X. Also, the rack 4 and the rail body 5 are disposed separately in the width direction Y, and are supported by the support 3 from below. Also, the rack 4 and the rail body 5 are arranged so that their surfaces facing each other in the width direction Y are in parallel to each other. That is to say, both of the surface of the rack 4 that faces the rail body 5 in the width direction Y, and the surface of the rail body 5 that faces the rack 4 in the width direction Y are surfaces parallel to the up-down direction and the travel direction X. In this example, the rack 4 is provided in an orientation such that it engages with the pinion 91 from below. Also, the rail body 5 is provided in an orientation such that it engages with the guided part 92 on the upper side thereof. In the shown example, the rack 4 is disposed on the first side Y1 in the width direction relative to the rail body 5. Here, the rail body 5 and the guided part 92 constitute a linear guide, but various types of well-known direct acting guide mechanisms such as, for example, a ball spline or a linear bushing may also be used. Note that the third unit 65 also has the same configuration. Note that a configuration is possible in which the rail body 5 has an upper face or a side surface on which wheels can roll. In this case, the carriage 9 preferably includes wheels serving as the guided part 92. The following description is made with the support 3 of the first unit 11 defined as a first support 13, and the support 3 of the second unit 21 defined as a second support 23. Also, the description is made with the rack 4 of the first unit 11 defined as a first rack 14, and the rack 4 of the second unit 21 defined as a second rack 24. In the present embodiment, furthermore, the description is made with the rail body 5 of the first unit 11 defined as a first rail body 16, and the rail body 5 of the second unit 21 defined as a second rail body 26.

In the present embodiment, as shown in FIGS. 1 to 6, the support 3 includes a base member 41, and a rack support member 45 fixed to the base member 41. In this example, the base member 41 is a member that supports the rail body 5. The rack support member 45 is a member that supports the rack 4. The base member 41 and the rack support member 45 extend in the travel direction X. In this example, the rack support member 45 is a member that is formed with higher accuracy than that of the base member 41. The rack support member 45 is a member formed by cutting a piece of metal, for example. The base member 41 is a member formed by, for example, performing extrusion-molding using a metal such as aluminum.

The base member 41 is placed along the travel route for the carriage 9 on a floor surface. In the example shown in FIG. 1, the base member 41 is fixed to the floor surface via a pedestal 8. Also, the base member 41 supports the rail body 5 from below, and supports the rack support member 45 from below.

Figure 6:
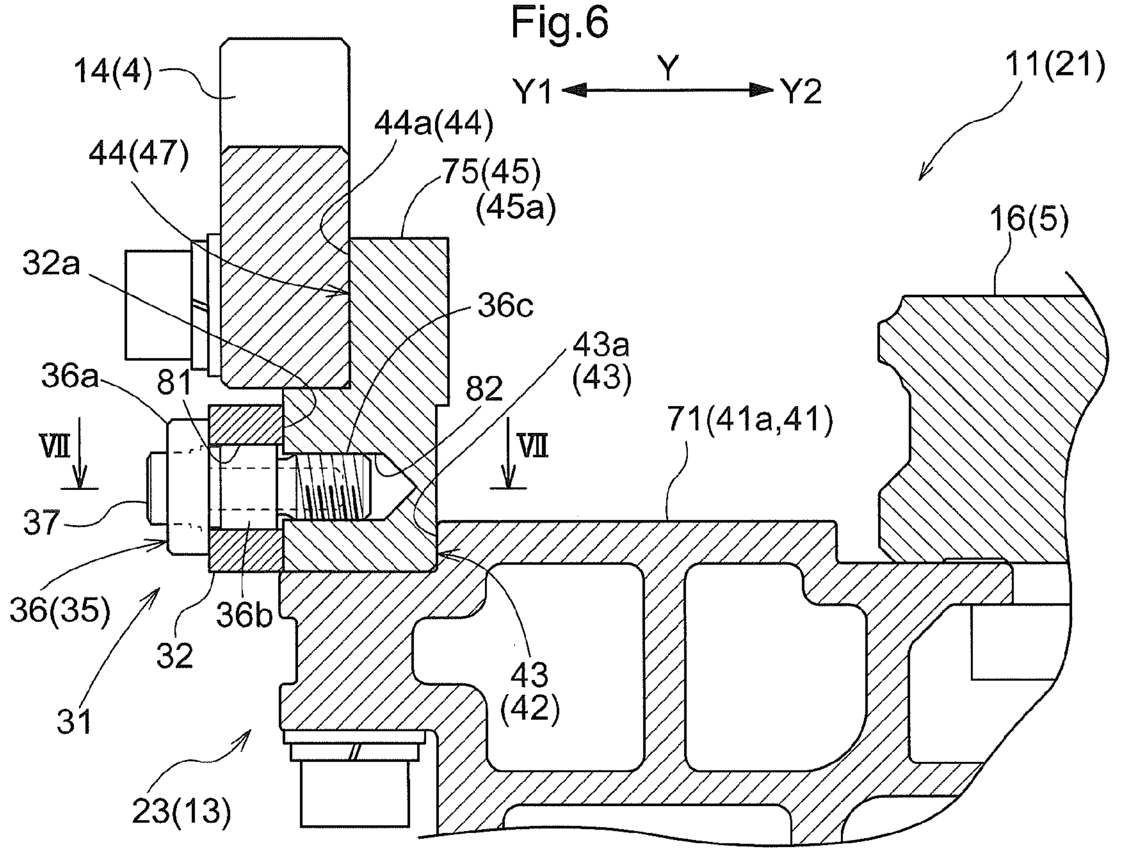
FIG. 6 is a cross-sectional view illustrating the rail.

In the example shown in FIGS. 1 and 6, the base member 41 includes a rack support member positioning part 42 for positioning the rack support member 45 in the width direction Y by abutting against the rack support member 45 from the second side Y2 in the width direction. The rack support member positioning part 42 has a first notch portion 43 (see FIGS. 1 and 6). Specifically, the first notch portion 43 is obtained by cutting the upper surface of the base member 41 at the end on the first side Y1 in the width direction so that the base member 41 is recessed downward and is open to the upper side and the first side Y1 in the width direction, and the first notch portion 43 spans the length of the base member 41 in the travel direction X. In the shown example, the first notch portion 43 is formed in a step-like manner when viewed in the travel direction X. The rack support member 45 is placed on the first notch portion 43, and is brought into contact with a first wall **43*a* of the first notch portion 43 formed on the second side Y2 in the width direction. With this, the rack support member 45 is restricted from moving toward the second side Y2 in the width direction, and the rack support member 45 is positioned with respect to the base member 41 in the width direction Y. In the shown example, the rack support member 45 is fixed to the base member 41 with a fastening member. Incidentally, when the rail body 5 is attached to the support 3, the rail body 5 is positioned in the width direction Y using a not-shown jig with the rack support member 45 fixed to the first notch portion 43 of the rack support member positioning part 42. Then, the rail body 5 is fixed to the base member 41 with a fastening member, and is supported by the base member 41 from below. Accordingly, due to the positioning using the not-shown jig, the rail body 5 is arranged in parallel to the rack support member 45. That is to say, both the rack support member 45 and the rail body 5 are arranged in parallel to the travel direction X. Note that the base member 41 may be directly fixed to the floor surface. Also, the rack support member 45 may be fixed to the floor surface via the pedestal 8 or directly, without being supported by the base member 41. Also, the base member 41 and the rack support member 45** may be formed as one piece.

As shown in FIGS. 1 to 6, the rack support member 45 supports the rack 4 from below. Also, the rack support member 45 includes a width-direction positioner 47 for positioning the rack 4 in the width direction Y by abutting against the rack 4 from the first side Y1 in the width direction or the second side Y2 in the width direction. The rack 4 is fixed to the rack support member 45 while in contact with the width-direction positioner 47 in the width direction Y. In this example, the width-direction positioner 47 of the rack support member 45 abuts against the rack 4 from the second side Y2 in the width direction to position the rack 4 in the width direction Y. In the example shown in FIGS. 1 and 6, the width-direction positioner 47 includes a second notch portion 44. Specifically, the second notch portion 44 is obtained by cutting the upper surface of the rack support member 45 at the end on the first side Y1 in the width direction so that the rack support member 45 is recessed downward and is open to the upper side and the first side Y1 in the width direction, and the second notch portion 44 spans the length of the rack support member 45 in the travel direction X. In the shown example, the second notch portion 44 is formed in a step-like manner when viewed in the travel direction X. The rack 4 is placed on the second notch portion 44, and is brought into contact with a second wall 44*a* of the second notch portion 44 formed on the second side Y2 in the width direction. With this, the rack 4 is restricted from moving toward the second side Y2 in the width direction, and the rack 4 is positioned with respect to the rack support member 45 in the width direction Y. In the shown example, the rack 4 is fixed to the rack support member 45 with a fastening member. The rack 4 is mounted along the entire length of the rack support member 45 in the travel direction X. Due to the positioning using the width-direction positioner 47, the rack 4 is disposed in parallel to the rack support member 45 in the travel direction X. Accordingly, as described above, the rack 4 is also arranged in parallel to the rail body 5 positioned using the jig, in the travel direction X. Specifically, the surface (facing the first side Y1 in the width direction, here) of the rack support member 45 that forms the width-direction positioner 47, and the surface (facing the second side Y2 in the width direction, here) of the rack support member 45 against which the above-described jig abuts are arranged in parallel to each other, thus making it easy to arrange the rack 4 and the rail body 5 so that they are in parallel to each other, in other words, it is easy to arrange both the rack 4 and the rail body 5 in parallel to the travel direction X. Note that the third unit 65 also has the same basic configuration as those of the first unit 11 and the second unit 21.

In the present embodiment, the configuration of the rack support member 45 of the first unit 11 and the configuration of the rack support member 45 of the second unit 21 partially differ from each other. Hereinafter, the difference in configuration between the rack support members 45 will be described in more detail. Here, the rack support member 45 of the first unit 11 is defined as a first rack support member 45*a*, and the rack support member 45 of the second unit 21 is defined as a second rack support member 45*b*. Also, the base member 41 of the first unit 11 is defined as a first base member 41*a*, and the base member 41 of the second unit 21 is defined as a second base member 41*b*.

In the present embodiment, as shown in FIGS. 2 to 6, one of the first unit 11 and the second unit 21 is defined as a target unit 51, and the other one is defined as a counterpart unit 52, the base member 41 of the target unit 51 is defined as a target base member 71, and the base member 41 of the counterpart unit 52 is defined as a counterpart base member 73, and the rack support member 45 of the target unit 51 is defined as a target rack support member 75, and the rack support member 45 of the counterpart unit 52 is defined as a counterpart rack support member 76. In this example, the first unit 11 serves as the target unit 51, and the second unit 21 serves as the counterpart unit 52. In this case, the first base member 41*a* serves as the target base member 71, and the second base member 41*b* serves as the counterpart base member 73. Also, the first rack support member 45*a* serves as the target rack support member 75, and the second rack support member 45*b* serves as the counterpart rack support member 76. Here, in a state in which the first unit 11 and the second unit 21 are not coupled to each other (hereinafter, also referred to as a separate state), the target rack support member 75 is supported by the target base member 71 from below, and the counterpart rack support member 76 is supported by the counterpart base member 73 from below. Note that the first rack 14 is provided spanning the entire length of the first rack support member 45*a* in the travel direction X, and the second rack 24 is provided spanning the entire length of the second rack support member 45*b* in the travel direction X.

Note that a configuration is also possible in which the second unit 21 serves as the target unit 51, and the first unit 11 serves as the counterpart unit 52. In this case, the second base member 41*b* serves as the target base member 71, and the first base member 41*a* serves as the counterpart base member 73. Also, the second rack support member 45*b* serves as the target rack support member 75, and the first rack support member 45*a* serves as the counterpart rack support member 76.

Figure 3:
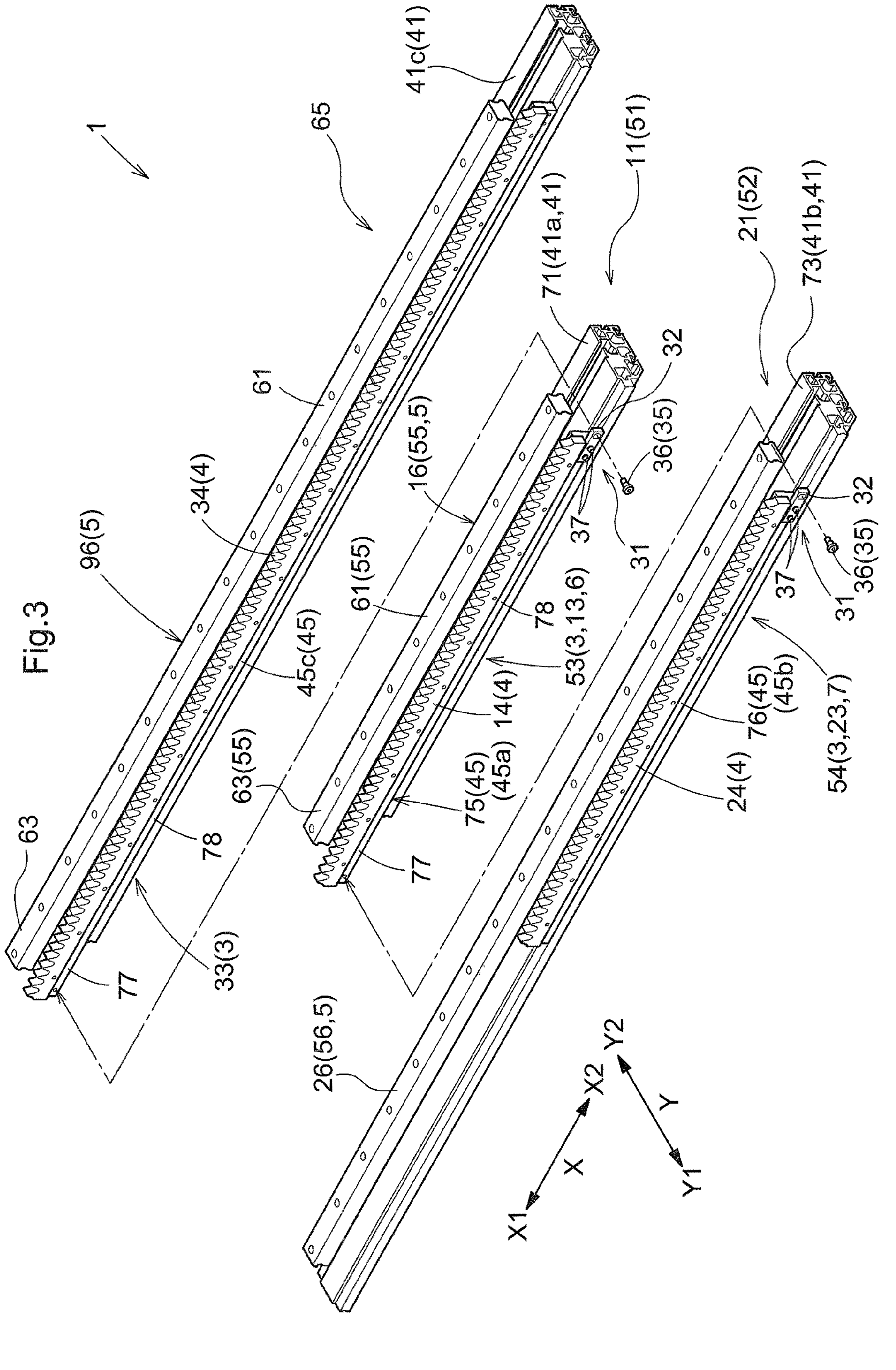
FIG. 3 is a perspective view illustrating a first unit, a second unit, and a third unit.
Figure 4:
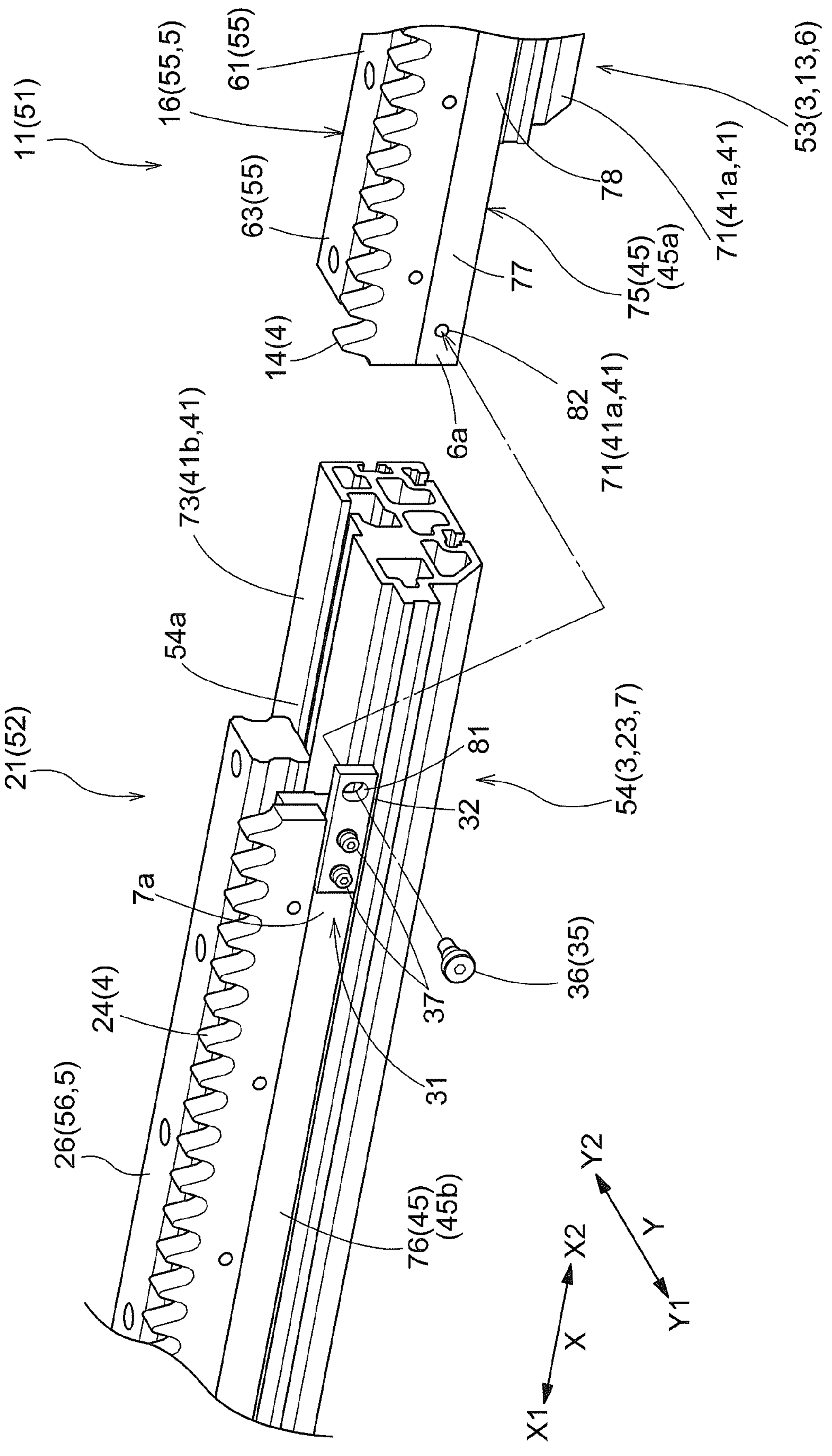
FIG. 4 is an enlarged view illustrating a main portion in which the first unit and the second unit are coupled to each other.
Figure 5:
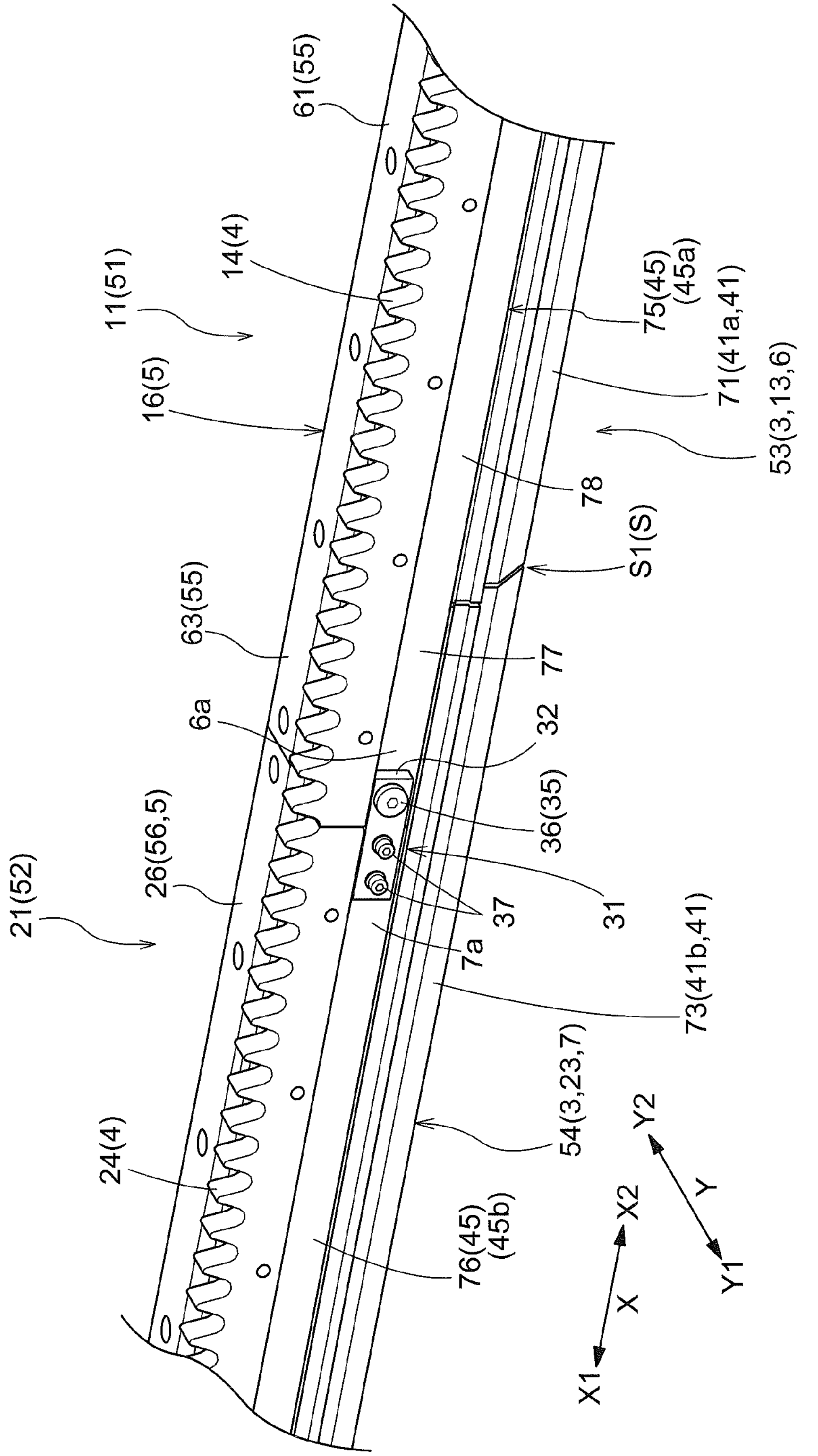
FIG. 5 is an enlarged view illustrating the main portion in which the first unit and the second unit are coupled to each other.

As shown in FIGS. 2 to 5, in the present embodiment, the target rack support member 75 includes a target support body section 78 that is a portion whose arrangement region in the travel direction X overlaps the target base member 71, and a target support extension section 77 that is a portion whose arrangement region in the travel direction X overlaps the counterpart base member 73. In this example, the first rack support member 45*a* serving as the target rack support member 75 includes the target support body section 78 and the target support extension section 77. The target support body section 78 overlaps the first base member 41*a* serving as the target base member 71 when viewed in the up-down direction. The target support extension section 77 extends to the first side X1 in the travel direction from the end of the target support body section 78 on the first side X1 in the travel direction. Also, the target support extension section 77 is disposed so as not to overlap the target base member 71 (here, the first base member 41*a*) when viewed in the up-down direction. Also, in this example, as shown in FIG. 5, in a state in which the first unit 11 and the second unit 21 are coupled to each other by the coupling mechanism 31 (hereinafter, also referred to simply as a coupled state), the target support extension section 77 is disposed above the counterpart base member 73 (here, the second base member 41*b*) and overlaps the counterpart base member 73 when viewed in the up-down direction. Note that, when the second unit 21 serves as the target unit 51 and the first unit 11 serves as the counterpart unit 52, the second rack support member 45*b* serving as the target rack support member 75 includes the target support body section 78 and the target support extension section 77.

Also, in the present embodiment, as shown in FIGS. 4 and 5, the counterpart rack support member 76 is arranged in such a manner that an arrangement region of the counterpart rack support member 76 in the travel direction X does not overlap an overlap portion of the counterpart base member 73, the overlap portion being a portion whose arrangement region in the travel direction X overlaps the target support extension section 77. In this example, in the coupled state, the counterpart rack support member 76 (here, the second rack support member 45*b*) is not disposed in a portion of the counterpart base member 73 (the second base member 41*b*) that overlaps the target support extension section 77 in the up-down direction. With this, when coupling the first unit 11 and the second unit 21 to each other, it is possible to prevent such a situation where the counterpart rack support member 76 and the target support extension section 77 interfere with each other. Also, in the present embodiment, as shown in FIGS. 2, 5, and 6, the target support body section 78 is fixed to the target base member 71, and the target support extension section 77 is fixed to the counterpart base member 73. In this example, the target support body section 78 is fixed to the first notch portion 43 (the rack support member positioning part 42) of the target base member 71 (here, the first base member 41*a*). Also, in the coupled state, the target support extension section 77 of the target rack support member 75 (here, the first rack support member 45*a*) is fixed to the first notch portion 43 (the rack support member positioning part 42) of the counterpart base member 73 (here, the second base member 41*b*). With this, the target rack support member 75 can fix the positional relationship between the target base member 71 and the counterpart base member 73 in the up-down direction. Also, in the coupled state, the target rack support member 75 is supported by both the target base member 71 and the counterpart base member 73 from below. Note that a configuration is also possible in which the target support extension section 77 is fixed to, for example, a side surface (facing the width direction Y) of the counterpart base member 73.

In the present embodiment, as shown in FIGS. 2 to 6, the support 3 of the target unit 51 is defined as a target support 53, and the support 3 of the counterpart unit 52 is defined as a counterpart support 54, and the rail body 5 of the target unit 51 is defined as a target rail body 55, and the rail body 5 of the counterpart unit 52 is defined as a counterpart rail body 56. In this example, the first support 13 of the first unit 11 serves as the target support 53, and the second support 23 of the second unit 21 serves as the counterpart support 54. Also, the first rail body 16 of the first unit 11 serves as the target rail body 55, and the second rail body 26 of the second unit 21 serves as the counterpart rail body 56. Here, in the separate state, the target rail body 55 is supported by the target support 53, and the counterpart rail body 56 is supported by the counterpart support 54. More specifically, in the separate state, the target rail body 55 is supported by the target base member 71 from below, and the counterpart rail body 56 is supported by the counterpart base member 73 from below.

Note that, when the second unit 21 serves as the target unit 51, and the first unit 11 serves as the counterpart unit 52, the second support 23 of the second unit 21 serves as the target support 53, and the first support 13 of the first unit 11 serves as the counterpart support 54. Also, the second rail body 26 of the second unit 21 serves as the target rail body 55, and the first rail body 16 of the first unit 11 serves as the counterpart rail body 56.

As shown in FIGS. 2 to 5, the target rail body 55 includes a target body section 61 overlapping the target support 53 when viewed in the up-down direction, and a target extension section 63 overlapping the counterpart support 54 when viewed in the up-down direction. In this example, the first rail body 16 serving as the target rail body 55 includes the target body section 61 and the target extension section 63. The target rail body 55 overlaps the target support 53 (more specifically, the target base member 71) when viewed in the up-down direction. The target extension section 63 extends toward the first side X1 in the travel direction from the end of the target body section 61 on the first side X1 in the travel direction. Also, the target extension section 63 is disposed so as not to overlap the target support 53 (more specifically, the target base member 71) when viewed in the up-down direction. Also, in this example, in the coupled state as shown in FIG. 5, the target extension section 63 is disposed above the counterpart base member 73 (here, the second base member 41*b*) of the counterpart support 54, and overlaps the counterpart base member 73 when viewed in the up-down direction. Note that, when the second unit 21 serves as the target unit 51 and the first unit 11 serves as the counterpart unit 52, the second rail body 26 serving as the target rail body 55 includes the target body section 61 and the target extension section 63.

Figure 8:
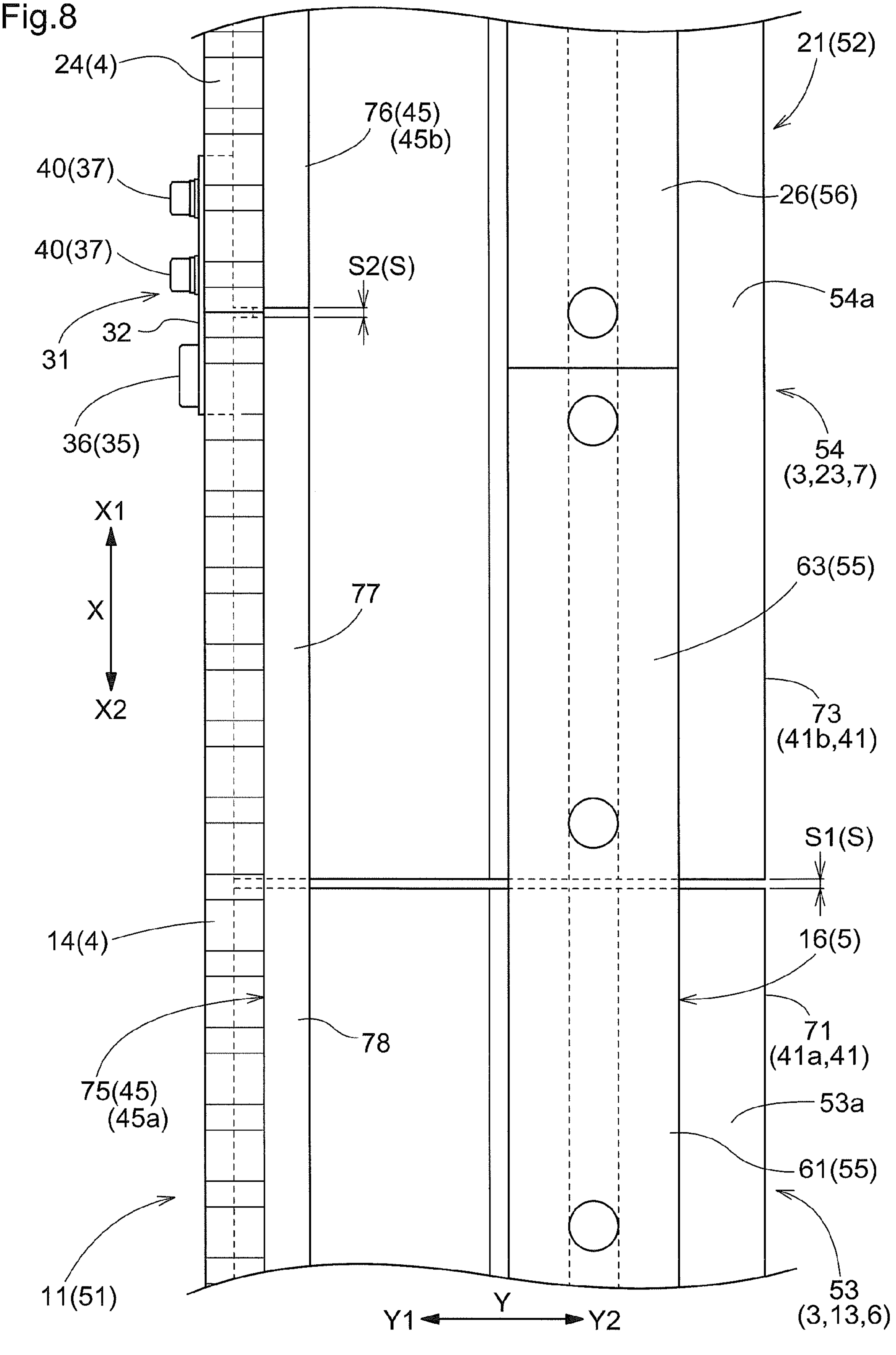
FIG. 8 is a plane view illustrating a state in which the first unit and the second unit are coupled to each other.

Also, in the present embodiment, as shown in FIGS. 5 and 8, the counterpart rail body 56 is disposed so as not to overlap a portion of the counterpart support 54 that overlaps the target extension section 63 when viewed in the up-down direction. In this example, in the coupled state, the counterpart rail body 56 (here, the second rail body 26) is not disposed in a portion of the counterpart support 54 (here, the second support 23) overlapping the target extension section 63 in the up-down direction. With this, when coupling the first unit 11 and the second unit 21 to each other, it is possible to prevent such a situation where the target rail body 55 and the counterpart rail body 56 interfere with each other. Also, in the present embodiment, the target body section 61 is fixed to an upper surface 53*a* of the target support 53, and the target extension section 63 is fixed to an upper surface 54*a* of the counterpart support 54. In this example, in the coupled state, the target body section 61 of the target rail body 55 is fixed to the upper surface 53*a* of the first support 13, and the target extension section 63 of the target rail body 55 is fixed to the upper surface 54*a* of the second support 23. That is to say, in the coupled state, the target rail body 55 is supported by both the first support 13 and the second support 23 from below. The upper surface of the first base member 41*a* is set as the upper surface 53*a* of the target support 53 (see FIG. 8), and the upper surface of the second base member 41*b* is set as the upper surface 54*a* of the counterpart support 54 (see FIGS. 3 and 8). Also, in the coupled state, the target body section 61 is fixed to the upper surface 53*a* of the first base member 41*a* with a fastening member, and the target extension section 63 is fixed to the upper surface 54*a* of the second base member 41*b* with a fastening member. Also, the target rail body 55 (the first rail body 16) is supported by both the target base member 71 (the first base member 41*a*) and the counterpart base member 73 (the second base member 41*b*) from below (see FIGS. 5 and 6).

In the example shown in FIG. 3, in the end region of the first unit 11 on the first side X1 in the travel direction, the target extension section 63 of the target rail body 55 (first rail body 16), and the target support extension section 77 of the target rack support member 75 (first rack support member 45*a*) protrude toward the first side X1 in the travel direction from the first base member 41*a*. On the other hand, in the end region of the first unit 11 on the second side X2 in the travel direction, the first rail body 16 and the first rack support member 45*a* are not provided. That is to say, in the end region of the first unit 11 on the second side X2 in the travel direction, only the first base member 41*a* is disposed. Also, in the end region of the second unit 21 on the second side X2 in the travel direction, the second rail body 26 serving as the counterpart rail body 56, and the second rack support member 45*b* serving as the counterpart rack support member 76 are not provided.

Also, in the example shown in FIG. 3, the third unit 65 includes a third rack 34 serving as the rack 4, a third rail body 96 serving as the rail body 5, and a third support 33 serving as the support 3. Also, the third support 33 includes a third rack support member 45*c* serving as the rack support member 45, and a third base member 41*c* serving as the base member 41. The third unit 65 basically has the same structure as that of the first unit 11, and the difference in configuration between the third unit 65 and the first unit 11 is only that they have different lengths in the travel direction X. That is to say, similar to the first rail body 16 of the first unit 11, the third rail body 96 of the third unit 65 includes a target body section 61 and a target extension section 63. Also, similar to the first rack support member 45*a*, the third rack support member 45*c* includes a target support body section 78 and a target support extension section 77. Also, in such a configuration, similar to the coupling between the first unit 11 and the second unit 21, the third unit 65 and the second unit 21 can be directly coupled to each other by the coupling mechanism 31.

As shown in FIGS. 4, 5, 7, and 8, the coupling mechanism 31 is configured to couple a first target member 6, which is a coupling target that is either the first support 13 or the first rack 14, to a second target member 7, which a coupling target that is either the second support 23 or the second rack 24. In the present embodiment, the coupling mechanism 31 is configured to couple the first support 13 to the second support 23. That is to say, the first support 13 serves as the first target member 6, and the second support 23 serves as the second target member 7. The following will describe a specific configuration of the coupling mechanism 31.

Figure 7:
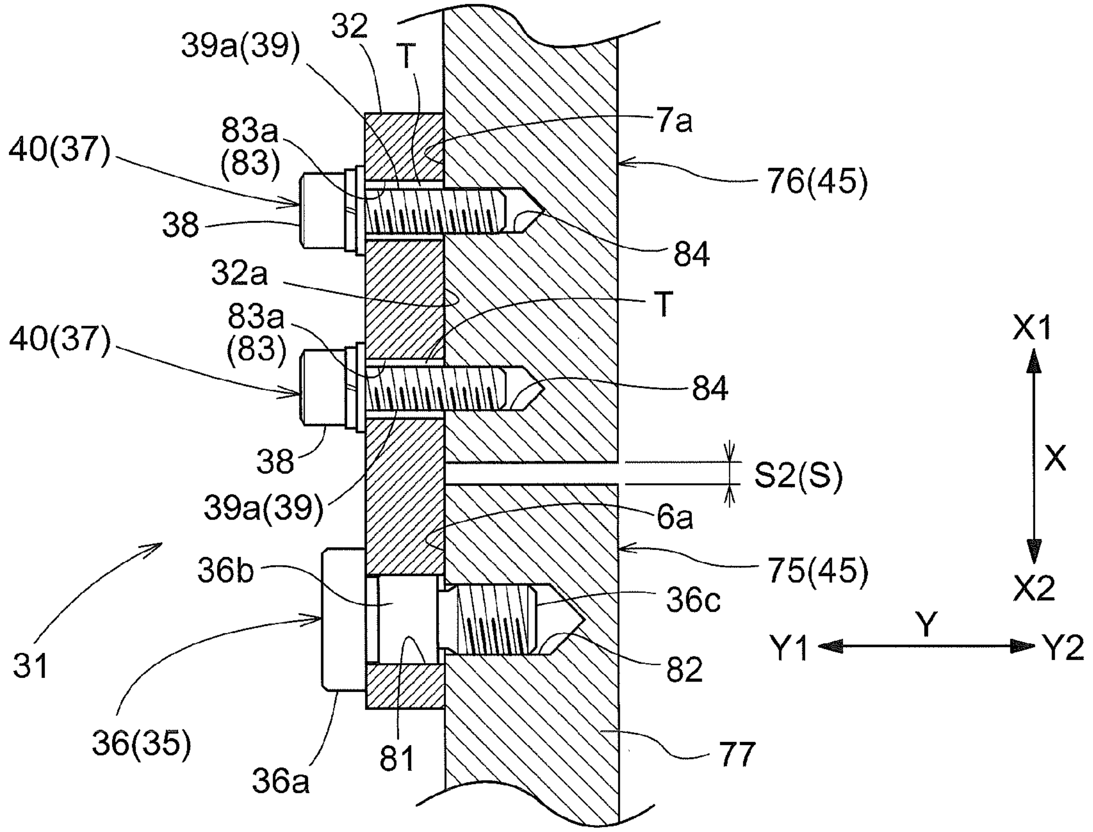
FIG. 7 is a cross-sectional view (taken along a line VII-VII in FIG. 6) illustrating a rack support member and a coupling member.

As shown in FIGS. 4, 5, and 7, the coupling mechanism 31 includes: a coupling member 32 having a reference abutment face 32*a* that abuts against both a first reference face 6*a*, which is a reference face of the first target member 6 facing the first side Y1 in the width direction, and a second reference face 7*a*, which is a reference face of the second target member 7 facing the first side Y1 in the width direction; a first fixing member 35 that fixes the coupling member 32 to the first target member 6; and a second fixing member 37 that fixes the coupling member 32 to the second target member 7. In the present embodiment, the first support 13 and the coupling member 32 are fixed to each other by the first fixing member 35. Also, the second support 23 and the coupling member 32 are fixed to each other by the second fixing member 37.

In the present embodiment, as shown in FIGS. 1, 4 to 6, and 8, the coupling member 32 is disposed at a different position from the first rail body 16 and the second rail body 26 in the width direction Y. In this example, in the coupled state, the coupling member 32 is disposed on the first side Y1 in the width direction relative to the first rail body 16 and the second rail body 26. Also, in the separate state, the coupling member 32 is fixed to the end of the counterpart rack support member 76 (second rack support member 45*b*) of the counterpart unit 52 (here, the second unit 21) on the second side X2 in the travel direction, and is disposed at a position shifted with respect to the second rail body 26 in the width direction Y. The second reference face 7*a* is a surface of the counterpart rack support member 76 facing the first side Y1 in the width direction, and is set in the end region on the second side X2 in the travel direction. The coupling member 32 is fixed to this second reference face 7*a* with the second fixing member 37, and protrudes to the second side X2 in the travel direction from the second reference face 7*a*. The first reference face 6*a* is a surface of the target rack support member 75 (first rack support member 45*a*) of the target unit 51 (here, the first unit 11) facing the first side Y1 in the width direction, and is set in the end region on the first side X1 in the travel direction. Also, in a state in which the target unit 51 and the counterpart unit 52 are coupled to each other, the first reference face 6*a* is arranged adjacent to the second reference face 7*a* on the second side X2 in the travel direction. Accordingly, in the coupled state, a portion of the coupling member 32 protruding from the second reference face 7*a* to the second side X2 in the travel direction is fixed to the first reference face 6*a*. Here, the coupling member 32 is a plate-shaped member, and the surface thereof facing the second side Y2 in the width direction extends in the travel direction X and the up-down direction. Also, the surface of the coupling member 32 facing the second side Y2 in the width direction is defined as the reference abutment face 32*a*. With this, by fitting the coupling member 32, the reference abutment face 32*a* abuts against the first reference face 6*a* and the second reference face 7*a*. Accordingly, due to the reference abutment face 32*a*, the target rack support member 75 and the counterpart rack support member 76 are positioned in the width direction Y.

In the present embodiment, as shown in FIG. 7, the coupling mechanism 31 includes: a first circular hole 81 formed in one of the coupling member 32 and the first target member 6; a first female screw hole 82 formed in the other one of the coupling member 32 and the first target member 6; a second circular hole 83 formed in one of the coupling member 32 and the second target member 7; and a second female screw hole 84 formed in the other one of the coupling member 32 and the second target member 7. In this example, the first circular hole 81 is formed in the coupling member 32, and the first female screw hole 82 is formed in the target rack support member 75. The first circular hole 81 is formed so as to pass through the coupling member 32 in the width direction Y. The first female screw hole 82 is formed in the first reference face 6*a* of the target rack support member 75. Also, the first female screw hole 82 is formed at a position that corresponds to the first circular hole 81 when the coupling member 32 is fitted to the target rack support member 75. The second circular hole 83 is formed in the coupling member 32, and the second female screw hole 84 is formed in the counterpart rack support member 76. The second circular hole 83 is formed so as to pass through the coupling member 32 in the width direction Y. The second female screw hole 84 is formed in the second reference face 7*a* of the counterpart rack support member 76.

Also, the second female screw hole 84 is formed at a position that corresponds to the second circular hole 83 when the coupling member 32 is fitted to the counterpart rack support member 76.

In the example shown in FIG. 7, the first circular hole 81 is formed in the coupling member 32 while being aligned with the second circular hole 83 in the travel direction X. Also, a plurality of (here, two) second circular holes 83 are formed in the coupling member 32. The plurality of second circular holes 83 are also aligned in the travel direction X.

Also, a plurality of (here, two) second female screw holes 84 are formed in the second reference face 7*a* so as to correspond to the plurality of second circular hole 83. In the coupled state, the first circular hole 81 and the first female screw hole 82 overlap each other when viewed in the width direction Y, and the plurality of second circular holes 83 and the plurality of second female screw holes 84 overlap each other when viewed in the width direction Y. The first fixing member 35 is inserted into the first circular hole 81 and the first female screw hole 82, and the second fixing member 37 is inserted into the plurality of second circular holes 83 and the plurality of second female screw holes 84. With this, the coupling member 32 is fixed to the target rack support member 75 and the counterpart rack support member 76.

As shown in FIGS. 6 and 7, the first fixing member 35 is attachable to and detachable from at least either the coupling member 32 or the first target member 6, and the first fixing member 35 is configured to position the first target member 6 and the coupling member 32 by being fitted. In the present embodiment, the first fixing member 35 is attachable to and detachable from both the coupling member 32 and the first support 13. Also, when the first unit 11 and the second unit 21 are coupled to each other, the first fixing member 35 is configured to position the coupling member 32 and the first support 13. Also, in this example, the first fixing member 35 is configured to fix the coupling member 32 to the target rack support member 75 (the first rack support member 45*a* of the first support 13). In the present embodiment, the first fixing member 35 is a shoulder bolt 36 having the first head section 36*a*, a first tubular section 36*b* with such a diameter configured to be fitted into the first circular hole 81, and a first male screw section 36*c* that is screwed into the first female screw hole 82. In this example, the first tubular section 36*b* is formed so as to be fitted to the entire circumference of the first circular hole 81. Accordingly, as a result of the first tubular section 36*b* being fitted into the first circular hole 81, the coupling member 32 and the first support 13 are positioned in the travel direction X and the up-down direction. Note that, instead of the shoulder bolt 36, a positioning pin may be used as a member for positioning the coupling member 32 and the first support 13. In this case, the coupling mechanism 31 preferably has a separate fastening member for fixing the coupling member 32 and the first support 13. Also, a configuration is possible in which the first fixing member 35 is used to position the coupling member 32 and the first support 13 only in the travel direction X.

In the present embodiment, as shown in FIG. 7, the second fixing member 37 is capable of adjusting the relative positions of the second target member 7 and the coupling member 32, and is configured to fix the second target member 7 and the coupling member 32 at the adjusted relative positions. In the present embodiment, the second fixing member 37 is configured to be able to adjust the relative positions of the second support 23 of the second unit 21, and the coupling member 32. Also, the second fixing member 37 fixes the second support 23 and the coupling member 32 at the adjusted relative positions. The second fixing member 37 is a bolt 40 that includes a second head section 38, and a second drum section 39 having a male screw 39*a*, and is screwed into the second female screw hole 84, and when the second drum section 39 is screwed into the second female screw hole 84, a gap T for relative position adjustment is formed between the second drum section 39 and an inner circumferential surface 83*a* of the second circular hole 83. The second fixing member 37 can use the gap T to adjust the relative positions of the second target member 7 and the coupling member 32. In this example, the diameter of the second drum section 39 is smaller than the inner circumferential surface 83*a* of the second circular hole 83, over the entire circumference. Accordingly, the gap T is formed radially outer side of the second drum section 39 over the entire circumference thereof when viewed in the width direction Y. Accordingly, the second fixing member 37 can adjust the relative positions of the second support 23 and the coupling member 32 in the travel direction X and the up-down direction. Note that, in this example, the bolt 40 is configured to be attachable to and detachable from the second support 23 and the coupling member 32. Note that, in the shown example, the second fixing member 37 is provided with the male thread 39*a* over the entirety of the second drum section 39, but the male thread 39*a* may be provided only in a region of the second drum section 39 on the leading end side. Also, the second fixing member 37 may be a shoulder bolt, similar to the first fixing member 35. Also, a configuration is possible in which the second circular hole 83 is greater only in the dimension in the travel direction X than the diameter of the second drum section 39. In this case, the second fixing member 37 can adjust the relative positions of the second support 23 and the coupling member 32 in the travel direction X. Also, the second fixing member 37 is preferably a bolt having a retaining function such as a spring bolt.

In the shown example, the second fixing member 37 is configured to be attachable to and detachable from both the coupling member 32 and the counterpart rack support member 76 (the second rack support member 45*b*), but if the positions of the coupling member 32 and the counterpart rack support member 76 can be adjusted in a loosely fastened state, the second fixing member 37 does not need to be attachable to and detachable from both of them.

In the present embodiment, as shown in FIG. 8, there is a gap S between the first support 13 and the second support 23 in the travel direction X, while the first unit 11 and the second unit 21 are coupled to each other by the coupling mechanism 31. In this example, in the coupled state, a first gap S1 is formed between the end of the first base member 41*a* on the first side X1 in the travel direction, and the end of the second base member 41*b* on the second side X2 in the travel direction, that is, between the adjacent first base member 41*a* and second base member 41*b*. Also, a second gap S2 is formed between the end of the first rack support member 45*a* on the first side X1 in the travel direction, and the end of the second rack support member 45*b* on the second side X2 in the travel direction, that is, between the adjacent first rack support member 45*a* and second rack support member 45*b* (see FIGS. 7 and 8). On the other hand, as shown in FIG. 8, the first rail body 16 and the second rail body 26 are in contact with each other in the travel direction X. In this example, there is no gap between the end of the first rail body 16 on the first side X1 in the travel direction and the end of the second rail body 26 on the second side X2 in the travel direction, and the surface of the first rail body 16 facing the first side X1 in the travel direction and the surface of the second rail body 26 facing the second side X2 in the travel direction are in contact with each other. Also, as described above, the coupling mechanism 31 is arranged at a position shifted with respect to the first rail body 16 and the second rail body 26 in the width direction Y. Accordingly, in the coupled state, the relative positions of the first unit 11 and the second unit 21 in the travel direction X can be restricted at two different positions in the width direction Y, that is, at the position at which the coupling mechanism 31 is arranged, and the position at which the first rail body 16 and the second rail body 26 are in contact with each other.

In this example, at a place (e.g., a factory) different from the place on which the rail 1 is installed, an operator or the like performs accuracy improvement so that the relative positions of the first unit 11 and the second unit 21 are appropriate. Specifically, the operator or the like attaches the first rack support member 45*a* to the first base member 41*a*, and attaches the second rack support member 45*b* to the second base member 41*b*. Then, the operator or the like couples the first rack support member 45*a* and the second rack support member 45*b* using the coupling member 32 so that they can move relative to each other. That is, at this stage, at least the second fixing member 37, out of the first fixing member 35 and the second fixing member 37, is loosely fastened. Then, the operator or the like adjusts the first rack support member 45*a* and the second rack support member 45*b* so that they are in an appropriate positional relationship. Specifically, the operator or the like uses the gap T to perform fine adjustment of the positions of the first support 13 (the first base member 41*a* and the first rack support member 45*a*) and the second support 23 (the second base member 41*b* and the second rack support member 45*b*) in the travel direction X, the width direction Y, and the up-down direction. After the first support 13 and the second support 23 have been adjusted into an appropriate positional relationship, the operator or the like fixes the coupling member 32 to both the first support 13 and the second support 23, for example, by fastening the loosely fastened second fixing member 37. Also, the operator or the like attaches the target support extension section 77 of the first rack support member 45*a* to the second base member 41*b*.

In a state in which the first support 13 and the second support 23 are coupled to each other by the coupling mechanism 31 in this way, the operator or the like attaches the first rail body 16 to the first base member 41*a*, and attaches the second rail body 26 to the second base member 41*b*. Also, the operator or the like attaches the target extension section 63 of the first rail body 16 to the second base member 41*b*. In this case, the operator or the like preferably uses a dedicated jig to make the rack support member 45 and the rail body 5 parallel to each other. Then, the operator or the like attaches the first rack 14 to the first rack support member 45*a*, and attaches the second rack 24 to the second rack support member 45*b*. In this case, the operator or the like preferably adjusts the relative positions of the first rack 14 and the second rack 24 so that the pitches of the gear wheels of adjacent portions of the racks are equal to the pitches of the gear wheels of the first rack 14 and the second rack 24, using a jig different from the above-described jig. Upon completion of the accuracy improvement for the first unit 11 and the second unit 21, the operator or the like removes the first fixing member 35 from the coupling member 32 and the first rack support member 45*a*, and separates the first unit 11 from the second unit 21. Note that, preferably, the operation order or the like of the accuracy improvement for the first unit 11 and the second unit 21 can be changed as appropriate.

When installing the rail 1 in an installation place for the rail 1 (for example, an automated warehouse), the operator or the like transports the first unit 11 and the second unit 21 that are separated after the accuracy improvement to the installation place. Then, the operator or the like couples the first unit 11 and the second unit 21 to each other using the first fixing member 35, while adjusting the positions of the first unit 11 and the second unit 21 in the up-down direction. Specifically, the operator or the like inserts the first fixing member 35 into the first circular hole 81 and the first female screw hole 82, and fastens the first fixing member 35. Also, the operator or the like attaches the target extension section 63 of the first rail body 16 to the second base member 41*b*, and attaches the target support extension section 77 of the first rack support member 45*a* to the second base member 41*b*. Note that, in the example shown in FIG. 3, operations of improving the accuracy and attaching the rail 1 to an installation place can also be performed on the first unit 11 and the third unit 65, similarly to the first unit 11 and the second unit 21.

Other Embodiments

The following will describe other embodiments of the rail.

Figure 9:
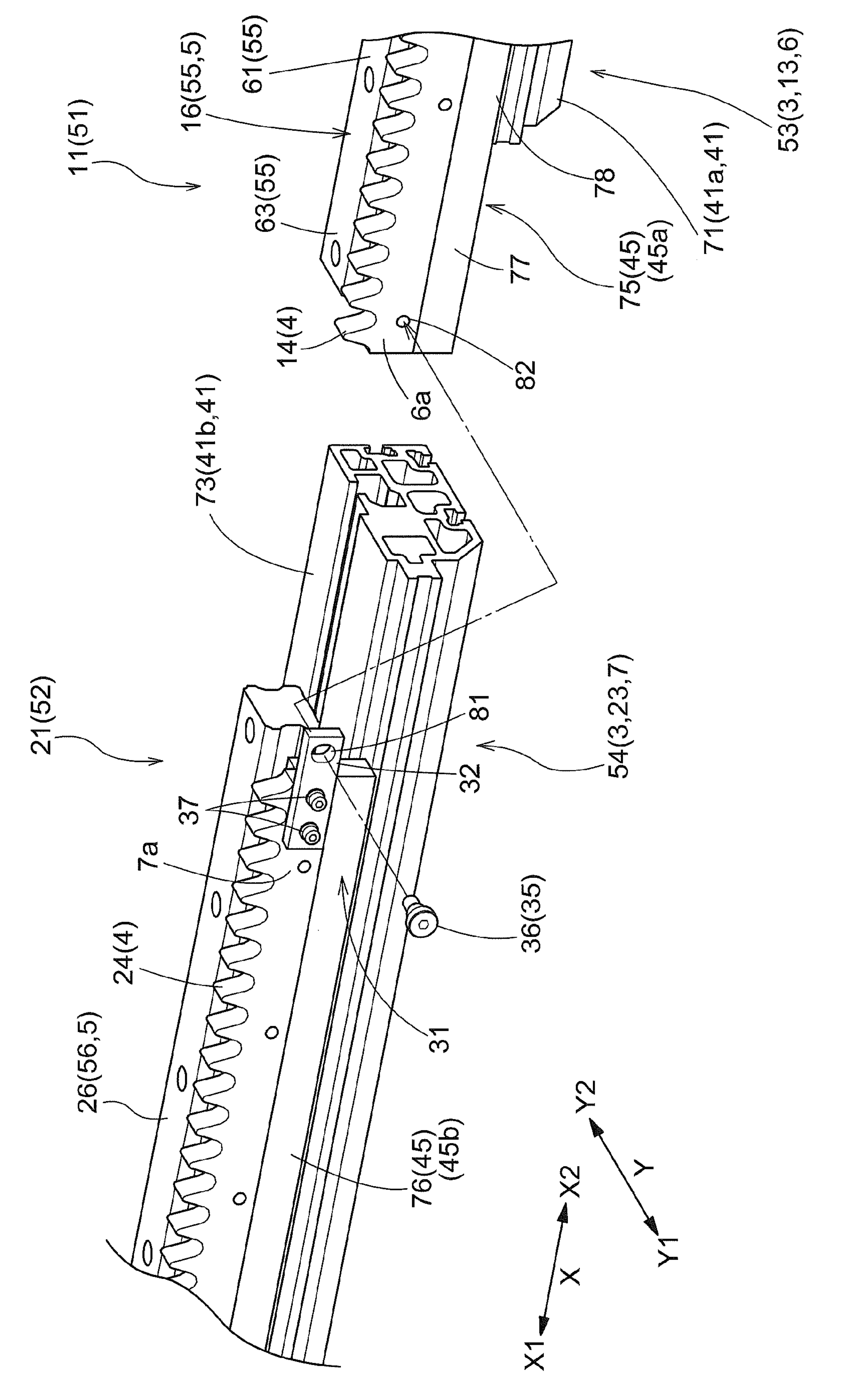
FIG. 9 is an enlarged view illustrating the main portion in which the first unit and the second unit are coupled to each other, according to another embodiment.

(1) The above-described embodiment has described, as an example, a configuration in which with the first target member 6 being the first support 13 and the second target member 7 being the second support 23, the first support 13 and the second support 23 are coupled to each other by the coupling mechanism 31, but the present invention is not limited to this. For example, a configuration is also possible in which with the first target member 6 being the first rack 14 and the second target member 7 being the second rack 24, the first rack 14 and the second rack 24 are coupled to each other by the coupling mechanism 31. Such an example is shown in FIG. 9. In FIG. 9, in the separate state, the coupling member 32 is fixed to the second rack 24 of the second unit 21. In more detail, the coupling member 32 is fixed to an end region of the second rack 24 on the second side X2 in the travel direction with the second fixing member 37. The first reference face 6*a* is a surface of the first rack 14 of the first unit 11 facing the first side Y1 in the width direction, and is set at the end on the first side X1 in the travel direction. The second reference face 7*a* is a surface of the second rack 24 facing the first side Y1 in the width direction, and is set at the end on the second side X2 in the travel direction. In a state in which the first unit 11 and the second unit 21 are coupled to each other, the reference abutment face 32*a* of the coupling member 32 is in contact with the second reference face 7*a*, the reference abutment face 32*a* is in contact with the first reference face 6*a*, and the coupling member 32 and the first rack 14 are coupled to each other by the first fixing member 35. With this, the first unit 11 and the second unit 21 are coupled to each other at appropriate relative positions. With this, a configuration is possible in which the first rack 14 and the second rack 24 are coupled to each other by the coupling mechanism 31.

Figure 10:
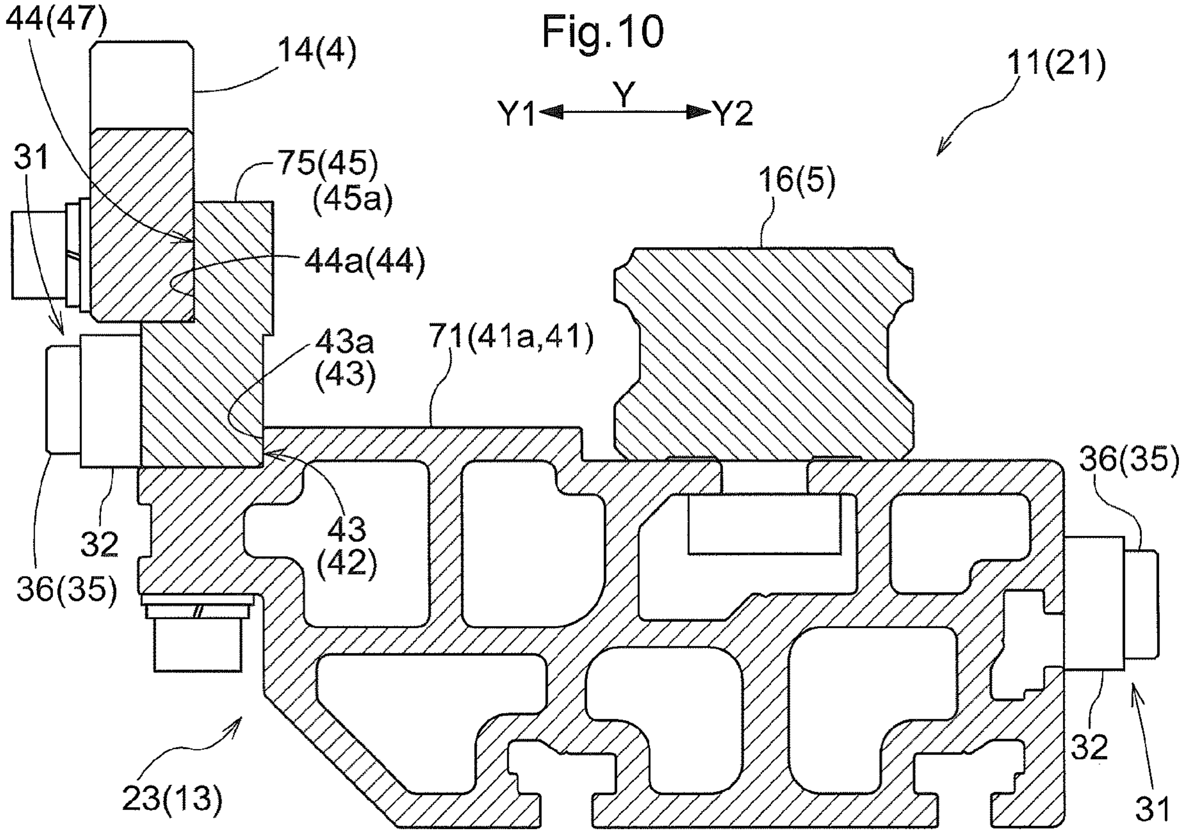
FIG. 10 is a cross-sectional view illustrating the rail according to the other embodiment.

(2) The above-described embodiment has described, as an example, a configuration in which the coupling mechanism 31 for coupling the first unit 11 and the second unit 21 is provided at an end of the support 3 on the first side Y1 in the width direction, but the present invention is not limited to this. For example, the coupling mechanism 31 may be provided at an end of the support 3 on the second side Y2 in the width direction. Such an example is shown in FIG. 10. In FIG. 10, coupling members 32 are attached to both the rack support member 45 arranged on the first side Y1 in the width direction of the base member 41, and the end of the base member 41 on the second side Y2 in the width direction. With this, the first unit 11 and the second unit 21 can be coupled to each other more firmly. Accordingly, a configuration is also possible in which the rail 1 includes a plurality of coupling mechanisms 31.

When the coupling mechanisms 31 are provided at a plurality of (two, in the example shown in FIG. 10) positions in the width direction Y, the relative positions of the first unit 11 and the second unit 21 in the travel direction X can be restricted at a plurality of positions in the width direction Y using the coupling mechanisms 31. In this case, it is not necessary to restrict the relative positions of the first unit 11 and the second unit 21 in the travel direction X by bringing the first rail body 16 and the second rail body 26 into contact with each other, and a configuration is possible in which, for example, the first rail body 16 and the second rail body 26 are not in contact with each other in the travel direction X while the first unit 11 and the second unit 21 are coupled to each other by the coupling mechanism 31, as will be described later.

(3) The above-described embodiment has described, as an example, a configuration in which there is a gap S between the first support 13 and the second support 23 in the travel direction X while the first unit 11 and the second unit 21 are coupled to each other by the coupling mechanism 31. But the present invention is not limited to this configuration, and a configuration is also possible in which there is no gap between the first support 13 and the second support 23 in the travel direction X while the first unit 11 and the second unit 21 are coupled to each other by the coupling mechanism 31.

(4) The above-described embodiment has described, as an example, a configuration in which the first rail body 16 and the second rail body 26 are in contact with each other in the travel direction X while the first unit 11 and the second unit 21 are coupled to each other by the coupling mechanism 31. But the present invention is not limited to this configuration, and a configuration is also possible in which, when the first unit 11 and the second unit 21 are coupled to each other by the coupling mechanism 31, the first rail body 16 and the second rail body 26 are not in contact with each other in the travel direction X, and there is a small gap between the first rail body 16 and the second rail body 26 in the travel direction X to the extent that the gap does not affect the travel of the carriage 9.

(5) The above-described embodiment has described, as an example, a configuration in which the target body section 61 is fixed to the upper surface 53*a* of the target support 53, and the target extension section 63 is fixed to the upper surface 54*a* of the counterpart support 54 in the coupled state, but the present invention is not limited to this. For example, in a configuration in which in each of the first unit 11 and the second unit 21, the rail body 5 is fixed to a side surface of the base member 41, it is preferable that the target body section 61 be fixed to the side surface of the base member 41 of the target support 53, and the target extension section 63 be fixed to the side surface of the base member 41 of the counterpart support 54 in the coupled state. With this, the position of the base member 41 at which the rail body 5 is fixed can be changed as needed.

(6) The above-described embodiment has described, as an example, a configuration in which the support 3 includes the base member 41, and the rack support member 45 fixed to the base member 41. But the present invention is not limited to this configuration, and the support 3 does not need to include the rack support member 45. In this case, the rack 4 is directly fixed to the base member 41. Accordingly, it is preferable that the base member 41 be provided with the width-direction positioner 47 for positioning the rack 4 in the width direction Y.

(7) The above-described embodiment has described, as an example, a configuration in which the target support body section 78 is fixed to the target base member 71, and the target support extension section 77 is fixed to the counterpart base member 73. But the present invention is not limited to this configuration, and the target support extension section 77 does not need to be fixed to the counterpart base member 73.

Figure 11:
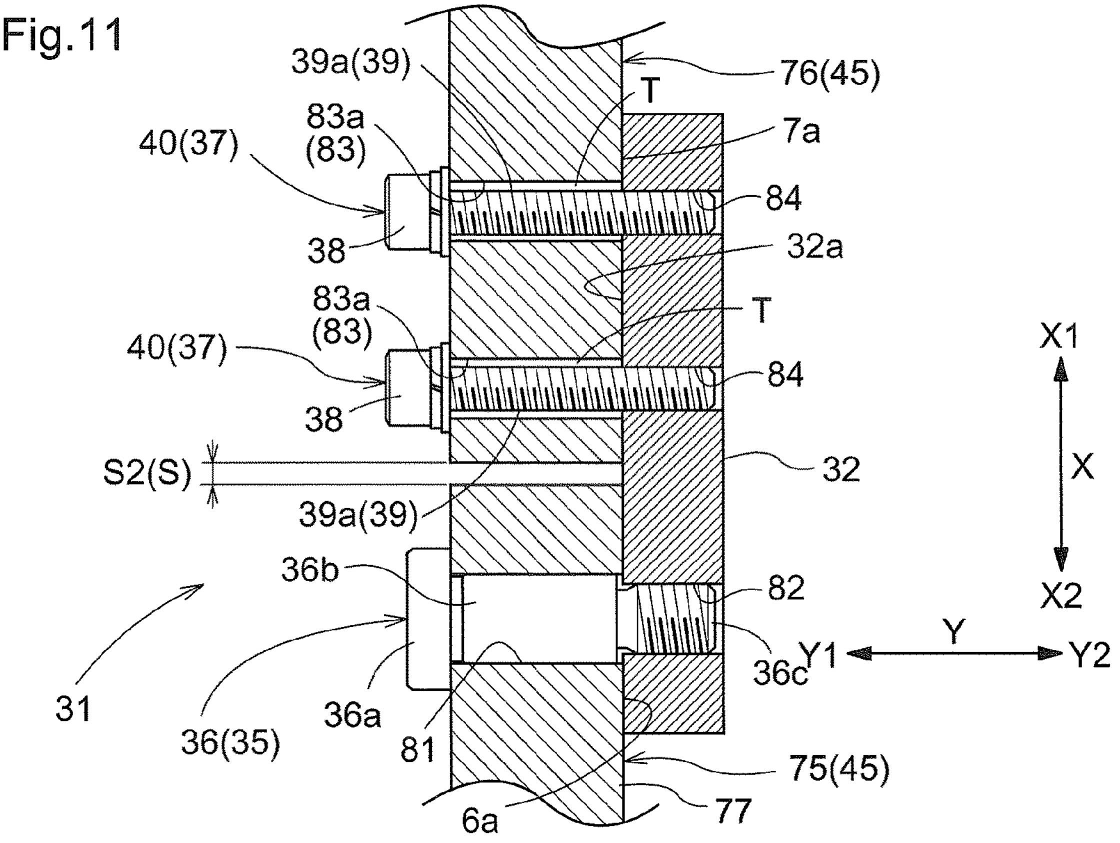
FIG. 11 is a cross-sectional view illustrating the rack support member and the coupling member according to the other embodiment.

(8) The above-described embodiment has described, as an example, a configuration in which the first circular hole 81 and the second circular hole 83 are formed in the coupling member 32, the first female screw hole 82 is formed in the first support 13, and the second female screw hole 84 is formed in the second support 23, but the present invention is not limited to this. For example, a configuration is also possible in which the first circular hole 81 is formed in the first support 13, the second circular hole 83 is formed in the second support 23, and the first female screw hole 82 and the second female screw hole 84 are formed in the coupling member 32. Such an example is shown in FIG. 11. In FIG. 11, the first reference face 6*a* is a surface of the target rack support member 75 facing the second side Y2 in the width direction, and the second reference face 7*a* is a surface of the counterpart rack support member 76 facing the second side Y2 in the width direction. Also, the reference abutment face 32*a* of the coupling member 32 abuts against the first reference face 6*a* and the second reference face 7*a* from the second side Y2 in the width direction of the rack support member 45. Also, the first fixing member 35 and the second fixing member 37 are inserted into the rack support member 45 from the first side Y1 in the width direction. Also, a configuration is possible in which the first circular hole 81 is formed in the first support 13, the first female screw hole 82 is formed in the coupling member 32, the second circular hole 83 is formed in the coupling member 32, and the second female screw hole 84 is formed in the second support 23. In this case, the second fixing member 37 is inserted into the rack support member 45 from the second side Y2 in the width direction.

Overview of the Embodiment

Hereinafter, the overview of the rail explained above will be described.

According to the present disclosure, a rail configured to guide a carriage traveling in a predetermined travel direction, the rail comprising:

- a first unit and a second unit each extending in the travel direction, and lined up in series in the travel direction; and
- a coupling mechanism configured to couple the first unit and the second unit to each other,
- wherein the first unit and the second unit each include:
  - a support;
  - a rack fixed to the support and configured to engage with a pinion of the carriage; and
  - a rail body fixed to the support while being parallel to the rack, and configured to guide travel of the carriage,
- with a width direction being a direction orthogonal to the travel direction when viewed in an up-down direction, a first side in the width direction being one side in the width direction, a second side in the width direction being another side in the width direction, a first support being the support of the first unit, a second support being the support of the second unit, a first rack being the rack of the first unit, and a second rack being the rack of the second unit,
- the coupling mechanism is configured to couple a first target member, which is a coupling target that is either the first support or the first rack, to a second target member, which is a coupling target that is either the second support or the second rack,
- the coupling mechanism includes:
  - a coupling member having a reference abutment face configured to abut against both a first reference face, which is a reference face of the first target member facing the first side in the width direction, and a second reference face, which is a reference face of the second target member facing the first side in the width direction;
  - a first fixing member configured to fix the coupling member to the first target member; and
  - a second fixing member configured to fix the coupling member to the second target member,
- the first fixing member is attachable to and detachable from at least either the coupling member or the first target member, and is configured to position the first target member and the coupling member by being attached, and
- the second fixing member is configured to adjust relative positions of the second target member and the coupling member, and is configured to fix the second target member and the coupling member at adjusted relative positions.

According to this configuration, the relative positions of the first target member and the second target member are adjusted, and then the first target member and the coupling member are fixed using the first fixing member, and the second target member and the coupling member are fixed using the second fixing member. This makes it possible to couple the first unit and the second unit in an appropriate relative position relationship.

Also, even when separating the coupled first and second units from each other, an operator can cancel the fixation between the first target member and the coupling member by the first fixing member, while maintaining the fixation between the second target member and the coupling member with the second fixing member. In doing so, when coupling the first unit and the second unit again, the operator can couple the first target member and the second target member in the previously adjusted relative position relationship simply by fitting the first fixing member.

That is to say, when the relative positions of the first target member and the second target member are adjusted and then the second target member and the coupling member are fixed to each other using the second fixing member, there is no need to perform the operation of adjusting the relative positions of the first target member and the second target member again when installing the rail, and the operator can couple the first unit and the second unit in an appropriate relative position relationship simply by fitting the first fixing member.

Therefore, according to this configuration, when installing the rail including the plurality of units, it is possible to easily perform an operation of coupling adjacent units to each other at appropriate relative positions.

Here, preferably, the first support and the second support are separated by a gap in the travel direction while the first unit and the second unit are coupled to each other by the coupling mechanism.

According to this configuration, even if the first support and the second support have a reduced dimensional accuracy, it is easy to couple the first unit and the second unit in an appropriate positional relationship.

Furthermore, preferably, with a first rail body being the rail body of the first unit, and a second rail body being the rail body of the second unit, the coupling member is disposed at a different position from the first rail body and the second rail body in the width direction, and the first rail body and the second rail body are in contact with each other in the travel direction.

According to this configuration, it is possible to restrict the relative positions of the first unit and the second unit in the travel direction not only using the coupling mechanism, but also by bringing the first rail body and the second rail body into contact with each other.

Also, since the coupling member is disposed at a different position from the first rail body and the second rail body in the width direction, it is possible to restrict the relative positions of the first unit and the second unit in the travel direction at two positions in the width direction. Accordingly, it is easy to increase the linearity of the layout of the first unit and the second unit.

Furthermore, preferably, with a target unit being one of the first unit and the second unit, a counterpart unit being another one of the first unit and the second unit, a target support being the support of the target unit, a counterpart support being the support of the counterpart unit, a target rail body being the rail body of the target unit, and a counterpart rail body being the rail body of the counterpart unit, the target rail body includes:

a target body section overlapping the target support when viewed in the up-down direction; and a target extension section overlapping the counterpart support when viewed in the up-down direction, the counterpart rail body does not overlap a portion of the counterpart support overlapping the target extension section when viewed in the up-down direction, and the target body section is fixed to an upper surface of the target support, and the target extension section is fixed to an upper surface of the counterpart support.

According to this configuration, in a state in which the first unit and the second unit are coupled to each other, the target extension section is fixed to the counterpart support. Accordingly, it is possible to couple the first unit and the second unit using not only the coupling member but also the target rail body. With this, the first unit and the second unit can be coupled to each other more firmly.

According to this configuration, since the target rail body is fixed to both the upper surface of the target support and the upper surface of the counterpart support, it is possible to fix the relative positions of the target support and the counterpart support in the up-down direction using the target rail body. Accordingly, it is possible to easily perform an operation of coupling the first unit and the second unit in an appropriate relative position relationship, also with respect to the up-down direction.

Furthermore, preferably, the support includes a base member, and a rack support member fixed to the base member, the rack support member includes a width-direction positioner configured to position the rack in the width direction by abutting against the rack from the first side in the width direction or the second side in the width direction, and the rack is fixed to the rack support member while in contact with the width-direction positioner in the width direction.

When a plurality of racks are aligned in the travel direction, it is necessary to adjust the relative positions of the plurality of racks in the travel direction so that the pitches of the gear wheels of the racks are equal to each other, and fix the racks to the rack support members.

According to this configuration, it is possible to perform an operation of fixing the racks to the rack support members, while positioning the rack support members in the width direction using the width-direction positioner. Accordingly, it is possible to easily perform the operations of adjusting the positions of the racks in the travel direction and fixing the racks to the rack support members.

Furthermore, preferably, with a target unit being one of the first unit and the second unit, a counterpart unit being another one of the first unit and the second unit, a target base member being the base member of the target unit, a counterpart base member being the base member of the counterpart unit, a target rack support member being the rack support member of the target unit, and a counterpart rack support member being the rack support member of the counterpart unit, the target rack support member includes:

a target support body section that is a portion whose arrangement region in the travel direction overlaps the target base member; and a target support extension section that is a portion whose arrangement region in the travel direction overlaps the counterpart base member, the counterpart rack support member is arranged in such a manner that an arrangement region of the counterpart rack support member in the travel direction does not overlap an overlap portion of the counterpart base member, the overlap portion being a portion whose arrangement region in the travel direction overlaps the target support extension section, the target support main body section is fixed to the target base member, and the target support extension section is fixed to the counterpart base member.

According to this configuration, the target rack support member is fixed to both the target base member and the counterpart base member. Therefore, the first unit and the second unit can be coupled to each other using not only the coupling member but also the rack support member. Accordingly, the first unit and the second unit can be coupled to each other more firmly.

Moreover, preferably, the coupling mechanism includes:

a first circular hole in one of the coupling member and the first target member;

a first female screw hole in another one of the coupling member and the first target member;

a second circular hole in one of the coupling member and the second target member; and a second female screw hole formed in another one of the coupling member and the second target member, the first fixing member is a shoulder bolt including:

a first head section;

a first tubular section with a diameter configured to be fitted into the first circular hole; and a first male screw section configured to be screwed into the first female screw hole, and the second fixing member is a bolt including:

a second head section; and a second drum section having a male thread, the second fixing member being configured to be screwed into the second female screw hole; and the second drum section and an inner circumferential surface of the second circular hole are separated by a gap for relative position adjustment while the second drum section has been screwed into the second female screw hole.

According to this configuration, the first fixing member can be attachable to and detachable from the coupling member and the first target member, and by screwing the first male screw section into the first female screw hole, it is possible to fit the first tubular section into the first circular hole, and position the first target member and the coupling member in the travel direction and the up-down direction.

Also, according to this configuration, the second fixing member can be attachable to and detachable from the coupling member and the second target member, and it is possible to adjust the relative positions of the second target member and the coupling member in the travel direction and the up-down direction, using the gap for relative position adjustment between the second drum section and the inner circumferential surface of the second circular hole in a state in which the male screw of the second drum section is screwed into the second female screw hole. Also, by fastening the coupling member and the second target member using the second fixing member, it is possible to fix the second target member and the coupling member at the adjusted relative positions.

It is sufficient for the rail according to the present disclosure to be able to realize at least one of the above-described effects.

What is claimed is:

1. A rail configured to guide a carriage traveling in a predetermined travel direction, the rail comprising:

a first unit and a second unit each extending in the travel direction, and lined up in series in the travel direction; and a coupling mechanism configured to couple the first unit and the second unit to each other, and wherein:

the first unit and the second unit each comprise:

a support;

a rack fixed to the support and configured to engage with a pinion of the carriage; and a rail body fixed to the support while being parallel to the rack, and configured to guide travel of the carriage, a width direction is a direction orthogonal to the travel direction when viewed in an up-down direction, a first side in the width direction is one side in the width direction, a second side in the width direction is another side in the width direction, a first support is the support of the first unit, a second support is the support of the second unit, a first rack is the rack of the first unit, and a second rack is the rack of the second unit, the coupling mechanism is configured to couple a first target member, which is a coupling target that is either the first support or the first rack, to a second target member, which is a coupling target that is either the second support or the second rack, the coupling mechanism comprises:

a coupling member having a reference abutment face configured to abut against both a first reference face, which is a reference face of the first target member facing the first widthwise side, and a second reference face, which is a reference face of the second target member facing the first side in the width direction;

a first fixing member configured to fix the coupling member to the first target member; and a second fixing member configured to fix the coupling member to the second target member, the first fixing member is attachable to and detachable from at least either the coupling member or the first target member, and is configured to position the first target member and the coupling member by being attached, the second fixing member is configured to adjust relative positions of the second target member and the coupling member, and is configured to fix the second target member and the coupling member at adjusted relative positions, a target unit is one of the first unit and the second unit, a counterpart unit is another one of the first unit and the second unit, a target support is the support of the target unit, a counterpart support is the support of the counterpart unit, a target rail body is the rail body of the target unit, and a counterpart rail body is the rail body of the counterpart unit, the target rail body comprises:

a target body section overlapping the target support when viewed in the up-down direction; and a target extension section overlapping the counterpart support when viewed in the up-down direction, the counterpart rail body does not overlap a portion of the counterpart support overlapping the target extension section when viewed in the up-down direction, and the target body section is fixed to an upper surface of the target support, and the target extension section is fixed to an upper surface of the counterpart support.

2. The rail according to claim 1, wherein the first support and the second support are separated by a gap in the travel direction while the first unit and the second unit are coupled to each other by the coupling mechanism.

3. The rail according to claim 2, wherein:
a first rail body is the rail body of the first unit, and a second rail body is the rail body of the second unit,
the coupling member is disposed at a different position from the first rail body and the second rail body in the width direction, and
the first rail body and the second rail body are in contact with each other in the travel direction.
4. The rail according to claim 1, wherein:
a first rail body is the rail body of the first unit, and a second rail body is the rail body of the second unit,
the coupling member is disposed at a different position from the first rail body and the second rail body in the width direction, and
the first rail body and the second rail body are in contact with each other in the travel direction.
5. The rail according to claim 1, wherein:
the support comprises a base member, and a rack support member fixed to the base member,
the rack support member comprises a width-direction positioner configured to position the rack in the width direction by abutting against the rack from the first side in the width direction or the second side in the width direction, and
the rack is fixed to the rack support member while in contact with the width-direction positioner in the width direction.
6. A rail configured to guide a carriage traveling in a predetermined travel direction, the rail comprising:
a first unit and a second unit each extending in the travel direction, and lined up in series in the travel direction; and
a coupling mechanism configured to couple the first unit and the second unit to each other, and
wherein:
the first unit and the second unit each comprise:
a support;
a rack fixed to the support and configured to engage with a pinion of the carriage; and
a rail body fixed to the support while being parallel to the rack, and configured to guide travel of the carriage,
a width direction is a direction orthogonal to the travel direction when viewed in an up-down direction, a first side in the width direction is one side in the width direction, a second side in the width direction is another side in the width direction, a first support is the support of the first unit, a second support is the support of the second unit, a first rack is the rack of the first unit, and a second rack is the rack of the second unit,
the coupling mechanism is configured to couple a first target member, which is a coupling target that is either the first support or the first rack, to a second target member, which is a coupling target that is either the second support or the second rack,
the coupling mechanism comprises:
a coupling member having a reference abutment face configured to abut against both a first reference face, which is a reference face of the first target member facing the first widthwise side, and a second reference face, which is a reference face of the second target member facing the first side in the width direction;
a first fixing member configured to fix the coupling member to the first target member; and
a second fixing member configured to fix the coupling member to the second target member,
the first fixing member is attachable to and detachable from at least either the coupling member or the first target member, and is configured to position the first target member and the coupling member by being attached,
the second fixing member is configured to adjust relative positions of the second target member and the coupling member, and is configured to fix the second target member and the coupling member at adjusted relative positions,
the coupling mechanism comprises:
a first circular hole in one of the coupling member and the first target member;
a first female screw hole in another one of the coupling member and the first target member;
a second circular hole in one of the coupling member and the second target member; and
a second female screw hole formed in another one of the coupling member and the second target member,
the first fixing member is a shoulder bolt comprising:
a first head section;
a first tubular section with a diameter configured to be fitted into the first circular hole; and
a first male screw section configured to be screwed into the first female screw hole,
the second fixing member is a bolt comprising:
a second head section; and
a second drum section having a male thread,
the second fixing member is configured to be screwed into the second female screw hole, and
the second drum section and an inner circumferential surface of the second circular hole are separated by a gap for relative position adjustment while the second drum section has been screwed into the second female screw hole.
7. The rail according to claim 6,
wherein the first support and the second support are separated by a gap in the travel direction while the first unit and the second unit are coupled to each other by the coupling mechanism.
8. The rail according to claim 6, wherein:
a first rail body is the rail body of the first unit, and a second rail body is the rail body of the second unit,
the coupling member is disposed at a different position from the first rail body and the second rail body in the width direction, and
the first rail body and the second rail body are in contact with each other in the travel direction.
9. The rail according to claim 6, wherein:
the support comprises a base member, and a rack support member fixed to the base member,
the rack support member comprises a width-direction positioner configured to position the rack in the width direction by abutting against the rack from the first side in the width direction or the second side in the width direction, and
the rack is fixed to the rack support member while in contact with the width-direction positioner in the width direction.
10. The rail according to claim 6, wherein:
the support comprises a base member, and a rack support member fixed to the base member,
a target unit is one of the first unit and the second unit, a counterpart unit is another one of the first unit and the second unit, a target base member is the base member of the target unit, a counterpart base member is the base member of the counterpart unit, a target rack support member is the rack support member of the target unit, and a counterpart rack support member is the rack support member of the counterpart unit, the target rack support member comprises:

a target support body section that is a portion whose arrangement region in the travel direction overlaps the target base member; and a target support extension section that is a portion whose arrangement region in the travel direction overlaps the counterpart base member, the counterpart rack support member is arranged in such a manner that an arrangement region of the counterpart rack support member in the travel direction does not overlap an overlap portion of the counterpart base member, the overlap portion is a portion whose arrangement region in the travel direction overlaps the target support extension section, the target support main body section is fixed to the target base member, and the target support extension section is fixed to the counterpart base member.

* * * * *